United States Patent
Burns et al.

(10) Patent No.: US 6,750,694 B1
(45) Date of Patent: Jun. 15, 2004

(54) SIGNAL CLIPPING CIRCUIT

(75) Inventors: Mark A. Burns, McKinney, TX (US); Ben D. Hodge, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/723,881

(22) Filed: Nov. 28, 2000

(51) Int. Cl.[7] .................................................. H03K 5/08
(52) U.S. Cl. ...................................... 327/321; 327/180
(58) Field of Search ................................. 327/309, 321, 327/180, 327, 328; 323/315; 330/288

(56) References Cited

U.S. PATENT DOCUMENTS

| | | | | |
|---|---|---|---|---|
| 5,293,081 A | * | 3/1994 | Chiao et al. | ................. 327/108 |
| 5,598,122 A | * | 1/1997 | McClure | ..................... 327/530 |
| 5,719,578 A | * | 2/1998 | Bohme | ....................... 341/161 |
| 5,923,590 A | * | 7/1999 | Yero | ..................... 365/189.01 |
| 6,166,670 A | * | 12/2000 | O'Shaughnessy | ........... 341/136 |
| 6,172,549 B1 | * | 1/2001 | Gilbert | ....................... 327/349 |

* cited by examiner

*Primary Examiner*—Timothy P. Callahan
*Assistant Examiner*—Cassandra Cox
(74) *Attorney, Agent, or Firm*—Ronald O. Neerings; W. James Brady, III; Frederick J. Telecky, Jr.

(57) ABSTRACT

A clipping circuit (20) for clipping an input signal to a level corresponding to a regulated power supply voltage (AVDD). The clipping circuit (20) includes a current mirror-like arrangement having a reference transistor (30) and a mirror transistor (32) The input signal (BDATA) is received at the drain of the mirror transistor (32), with the source of the mirror transistor (32) producing the output signal (CLPBDATA). The reference transistor (30) receives a bias current ($I_{BIAS}$) that is mirrored by the mirror transistor (32) to limit the pull-up drive of the mirror transistor (32) in pulling up the output (CLPBDATA). Disclosed embodiments of the clipping circuit (20; 20', 20") include a current source (29) for producing a DC bias current ($I_{BIAS}$), and a charge pump (34) for producing a transient bias current (IPUMP).

22 Claims, 3 Drawing Sheets

SIGNAL CLIPPING CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of electronic circuits, and is more specifically directed to input circuits for receiving communicated signals.

Especially with the increasing deployment of wireless communications and data processing systems, many modern electronic systems and their integrated circuits are now battery powered. In order to save power, and thus prolong battery life, these circuits and systems are designed to use low bias voltages, and also to use small voltage levels for their analog and digital signals.

However, some high voltage signals are often still required in these low voltage systems, for various reasons. It is therefore important to provide the capability for certain low voltage circuits in these systems to be able to receive and process signals at voltages that are in excess of their bias voltage.

Figure 1:
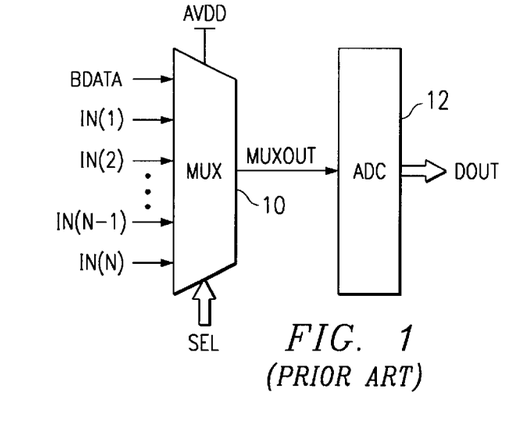
FIG. 1 is an electrical diagram, in block form, illustrating an example of conventional low voltage circuitry in connection with which the present invention may be implemented.

FIG. 1 illustrates an example of a conventional low voltage circuit that receives a high voltage signal for processing. According to this example, a multiple-input charge redistribution analog-to-digital converter (ADC) is provided by multiplexer 10 in combination with ADC 12. Multiplexer 10 receives the multiple analog input signals on lines BDATA, and IN(1) through IN(N). One of these inputs is selected by multiplexer 10 according to a selection signal on bus SEL, and is applied via line MUXOUT to an input of ADC 12. ADC 12, in turn, converts the analog signal selected by multiplexer 10 and presented on line MUX OUT into a digital signal, and forwards this signal on bus DOUT.

In this example of FIG. 1, however, multiplexer 10 is biased by power supply voltage AVDD, which may be a relatively low voltage, such as 2.75 volts derived from the output of a battery (not shown). Also in this example, input analog signals IN(1) through IN(N) have a voltage range from ground to voltage AVDD; however, input analog signal BDATA in this example can range to a much higher voltage than voltage AVDD, for example up to as high as 5.5 volts. This excessive input voltage on line BDATA presents a problem, particularly in the case where multiplexer 10 is constructed according to conventional techniques, such as a complementary metal-oxide-semiconductor (CMOS) pass gate, as will now be described relative to FIG. 2.

Figure 2:
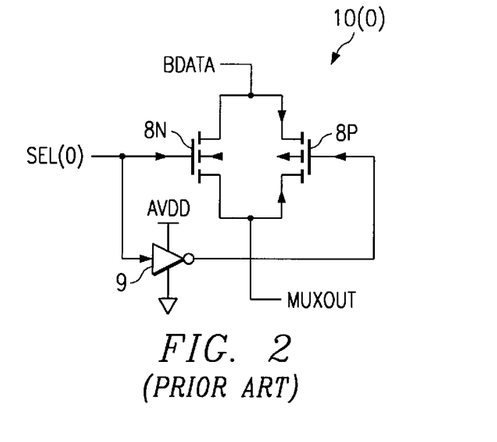
FIG. 2 is an electrical diagram in schematic form, of a stage in a multiplexer in the conventional circuitry of FIG. 1.

FIG. 2 illustrates multiplexer stage 10(0), which is effectively a pass gate associated with the BDATA input, controlled by a decoded select signal SEL(0) that is decoded from the selection signal on bus SEL. Such multiplexer construction is typical in the art, particularly for low voltage, low power, battery powered circuits that take advantage of the low standby power of CMOS technology. The pass gate of multiplexer stage 10(0) consists of n-channel MOS transistor 8N and p-channel MOS transistor 8P, which have their source-drain paths connected in parallel with one another between input BDATA and output MUXOUT. Transistors 8N, 8P have their gates controlled by the decoded signal on line SEL(0), directly in the case of transistor 8N and via inverter 9 in the case of transistor 8P. Inverter 9 is based by the low-voltage power supply voltage AVDD, and as such the gate voltages applied to the gate of transistor 8P will, in the digital sense, be either substantially at ground (input BDATA selected) or at voltage AVDD (input BDATA not selected).

In this example, the voltage of the analog input signal on line BDATA may exceed the voltage AVDD, in the case with input BDATA not selected. As noted above, inverter 9 applies a gate voltage of voltage AVDD to the gate of transistor 8P in the non-selected case. However, even with input BDATA not selected, transistor 8P will conduct if the voltage of the signal on line BDATA is higher than voltage AVDD by more than the threshold voltage of transistor 8P. In this case, the signal BDATA will be passed to output MUXOUT even though multiplexer 10 is not selecting this input. This event will cause multiplexer 10 to effectively pass two signals, only one of which is intended. This will, of course, present an erroneous voltage to the input of ADC 12 and result in an erroneous digital output on bus DOUT.

To alleviate his situation, conventional circuits have "clipped" the signal on input BDATA prior to its application to multiplexer 10, to reduce its voltage range to below bias voltage AVDD. Various conventional signal clipping approaches are well-known. One example of such a clipping circuit is simply to clip the signal with a simple resistor-diode network; however, this arrangement loads line BDATA if the input voltage causes the diode to conduct. In addition, the maximum signal voltage is necessarily reduced by a diode drop in this clipping circuit. If one were to buffer the signal on line BDATA with a voltage follower prior to the resistor-diode clipping circuit, the load on line BDATA would be reduced, at a cost of increased standby power, which is of course highly undesirable in battery-powered systems. Another approach is to insert a comparator and multiplexer to sense the high voltage input condition and to substitute the AVDD voltage as the input, at a cost of significant circuit complexity.

BRIEF SUMMARY OF THE INVENTION

It is therefore an object of the present invention to provide a clipping circuit for processing a high voltage signal prior to its application to circuitry biased by a lower power supply voltage.

It is a further object of the present invention to provide such a circuit in which no additional loading on the high voltage signal is applied by the circuit.

It is a further object of the present invention to provide such a circuit which dissipates little or no power supply current.

It is a further object of the present invention to provide such a circuit which itself is biased by the lower power supply voltage.

It is a further object of the present invention to provide such a circuit which may be efficiently implemented into an integrated circuit.

It is a further object of the present invention to provide such a circuit having stable operating characteristics over a wide range of manufacturing process parameters.

Other objects and advantages of the present invention will be apparent to those of ordinary skill in the art having reference to the following specification together with its drawing.

The present invention may be implemented into a clipping circuit including a current mirror-like clipping circuit. The current mirror has a reference leg biased between a source of limiting current and a lower power supply voltage at which downstream circuitry is biased. The current source may be a conventional current source biased from a higher voltage, or alternatively may be a charge pump circuit. Typically, the reference leg includes an n-channel MOS transistor that conducts a DC or pulsed bias current. The mirror leg, including an n-channel MOS device matched to that in the reference leg, is connected between a high voltage input node, and the output of the clipping circuit. In operation, the reference leg maintains the gate voltage of the nMOS device in the mirror leg at a level that briefly passes an input voltage that exceeds the power supply voltage, but then cuts off. The load presented by the clipping circuit is merely that of a single MOS device.

DETAILED DESCRIPTION OF THE INVENTION

As will become apparent from the following description, the present invention will be described in connection with an exemplary embodiment. Specifically the preferred embodiment of the invention described in this specification relates to the clipping of a high voltage input analog signal prior to the application of this signal to a low-power processing circuit, such as a charge redistribution analog-to-digital converter (ADC). It is contemplated that the present invention will, of course, provide important benefits in other applications and realizations, and that these alternatives also will be understood to be within the scope of the invention as claimed below.

Figure 3:
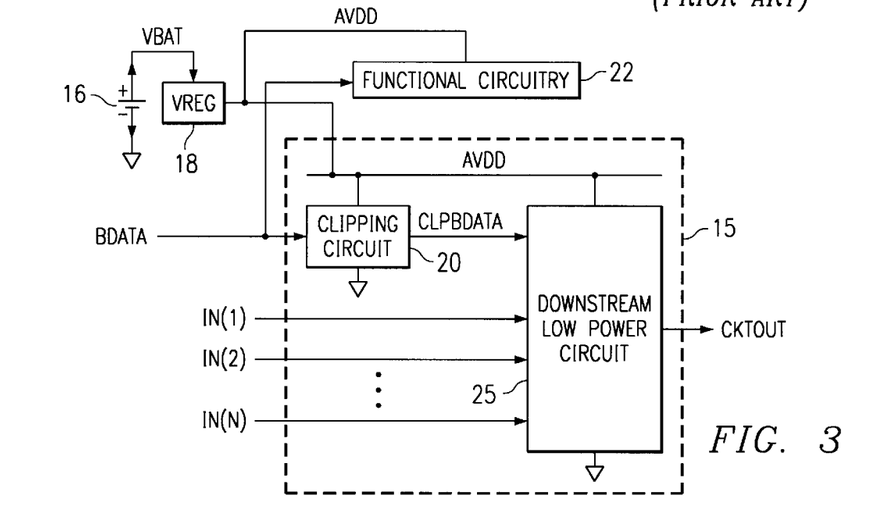
FIG. 3 is an electrical diagram, in a block form of an electronic circuit according to the preferred embodiments of the invention.

Referring now to FIG. 3, a generalized battery-powered electronic system into which a preferred embodiment of the invention is implemented will be described. The system of FIG. 3 includes functional circuitry 22, which performs the primary function of the system, for example operating as a cellular telephone, personal digital assistant (PDA), wireless telephone, notebook or palm-sized computer, or the like. In this system, battery 16 provides the DC power for the system, at battery power supply voltage VBAT. This voltage VBAT is applied to a voltage regulator 18, which generates regulated power supply-voltage AVDD. Voltage regulator 18 is generally necessary in battery-powered systems, given the wide voltage ranges that conventional batteries may provide, varying with temperature and remaining battery life. In order to maximize battery life, power supply voltage AVDD is kept at a relatively low voltage, for example at or below 2.75 volts according to current technology. This voltage AVDD biases functional circuitry 22, as shown in FIG. 3.

According to this exemplary system, power management function 15 is provided, for example to monitor power conditions of the system. As such, power management function 15 is not necessarily involved in the primary processing function of the system, but is instead a support circuit. Because of this support function, it is important that power management function 15 not present a significant load on those inputs that it receives in parallel with functional circuitry 22.

Power management function 15 includes downstream low power circuit 25, which generates an output on lines CKTOUT in response to multiple signals received on lines BDATA, and lines IN(1) through IN(N). These inputs are typically also provided to functional circuitry 22, as shown in FIG. 3 for the example of line BDATA. As noted above, it is important that downstream low power circuit 25 not present a significant load to this shared input on line BDATA, as such loading may affect the operation of functional circuitry 22. Downstream low power circuit 25 is biased by regulated power supply voltage AVDD, as shown in FIG. 3. Circuit 25 produces an output on line CKTOUT in response to inputs BDATA and IN(1) through IN(N), for example by providing a digital output signal corresponding to the analog level of a selected one of these inputs. An example of circuit 25 is a multiple-input charge redistribution ADC, as described above relative to FIGS. 1 and 2.

However, the input signal on line BDATA in this exemplary circuit may be at a voltage above power supply voltage AVDD, and above battery voltage VBAT, for example as high as 5.5 volts. An example of such a high voltage signal is an input voltage generated by a peripheral device to the system. According to this preferred embodiment of the invention, line BDATA is received by clipping circuit 20, which clips the voltage on line BDATA and applies this clipped voltage, on line CLPBDATA, to an input of downstream low-power circuit 25. In this example, clipping circuit 20 is itself also biased by power supply voltage AVDD.

Figure 4:
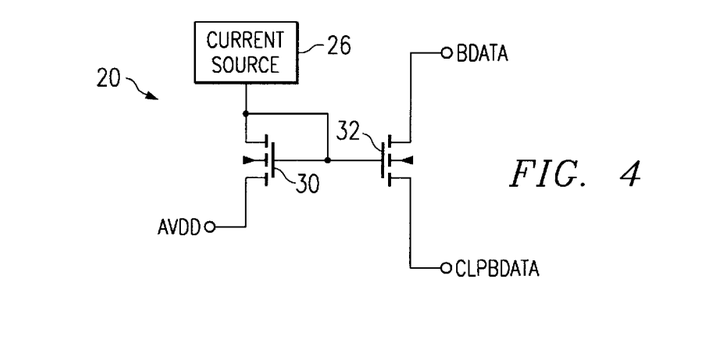
FIG. 4 is an electrical diagram, in a generalized block and schematic form, of a clipping circuit according to the preferred embodiment of the invention.

FIG. 4 illustrates, in a general sense, the construction of clipping circuit 20 according to the preferred embodiments of the invention. In this example, clipping circuit 20 includes a current-mirror like circuit, having a reference transistor 30 and a mirror transistor 32. Reference transistor 30 is an n-channel MOS transistor having its drain connected to current source 26 and to its gate, and having its source connected to regulated power supply voltage AVDD. N-channel transistor 32 has its drain receiving the signal on line BDATA, and its source driving line CLPBDATA; the gate of transistor 32 is connected to the gate (and thus the drain) of transistor 30.

Transistors 30, 32 are preferably matched in size, gain, and other characteristics with one another. Preferably, transistors 30, 32 are matched 1:1 with one another, so as to be substantially identical. Alternatively, transistor 32 may have a size that is an integral multiple of the size of transistor 30, so that the currents conducted by transistors 30, 32 would correlate with one another in the same relationship. Because of this matching in size, manufacturing variations will affect transistors 30, 32 in the same way, and substantially to the same extent, thus providing good stability in the operation of clipping circuit 20 over a wide range of processing and operating conditions.

In its general operation, clipping circuit 20 controls the current conducted by transistor 32 based upon the output voltage on line CLPBDATA and at the source of transistor 32. Current source 26 provides a current (either a steady-state current or a transient current, as will be described below) into the drain of transistor 30, so as to effectively bias the drain and gate of transistor 30 to at least a threshold voltage above its source voltage at power supply voltage AVDD. This biasing of transistor 30 both sets the gate voltage of transistor 32, and also establishes a limit on the current conducted by transistor 32.

For a signal voltage on line BDATA that is below power supply voltage AVDD, with the gate voltage of transistors 30, 32 biased to a threshold voltage above voltage AVDD, transistor 32 is simply turned on, and the voltage on line BDATA passes through to line CLPBDATA without modulation or clipping. For the case of a signal voltage on line BDATA that is above power supply voltage AVDD, transistor 32 pulls line CLPBDATA toward this voltage on line BDATA with a current as established by transistor 30. This pull-up condition continues until the source of transistor 32 reaches power supply voltage AVDD, at which point transistor 32 turns off because its gate-to-source voltage is then below its threshold voltage. Therefore, the voltage on line CLPBDATA is clipped to a voltage that does not exceed about the level of power supply voltage AVDD.

Clipping circuit 20 provides important benefits in the operation of the system of FIG. 3. First, clipping circuit 20 reliably clips any high voltage signal, for example above the power supply voltage, over a wide range of processing and manufacturing conditions, as a result of its matched transistor construction. In addition, the clipping circuit according to this embodiment of the invention presents very little load to the signal line; indeed, the load presented by the clipping circuit is no more than that which would otherwise be provided by a logic circuit or multiplexer.

Figure 5:
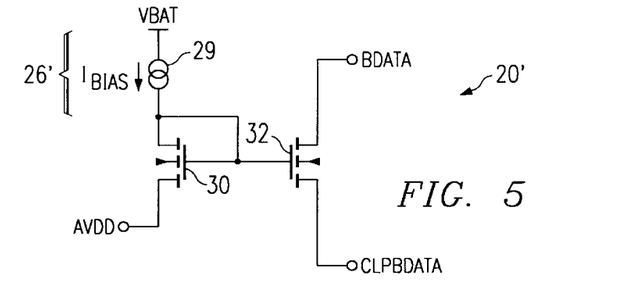
FIG. 5 is an electrical diagram, in schematic form, of a clipping circuit according to a first preferred embodiment of the invention.

Referring now to FIG. 5, clipping circuit 20' including current source 26' constructed according to a first preferred embodiment of the invention will now be described in detail. Clipping circuit 20' includes transistors 30, 32, connected in a current mirror-like fashion as described above. In this embodiment of the invention, current source 26' includes a conventional DC current source 29, biased by a voltage that is above power supply voltage AVDD by more than the threshold voltage of transistor 30, which in this example is battery voltage VBAT. It is contemplated, in this embodiment of the invention, that battery voltage VBAT should be at least one volt above power supply voltage AVDD. Current source 29 may be constructed in the conventional manner, for example as an MOS transistor having its gate biased by a stable reference voltage, to conduct a substantially constant current $I_{BIAS}$ into the drain of transistor 30.

The operation of clipping circuit 20' is substantially the same as that described above for the general case illustrated in FIG. 4. In this embodiment of the invention, current $I_{BIAS}$ is a constant, or DC, current, that is conducted by transistor 30, and thus by transistor 32 when transistor 32 remains on. The voltage at the gate of transistor 30, and thus at the gate of transistor 32, settles to a voltage that is about a threshold voltage above power supply voltage AVDD at the source of transistor 30.

For an input signal on line BDATA that is at a voltage below power supply voltage AVDD by more than a threshold voltage, transistor 32 is turned on and passes the voltage on line BDATA to line CLPBDATA without clipping or modulation. Upon the input signal on line BDATA exceeding the power supply voltage AVDD, transistor 32 pulls up line CLPBDATA with a current equal to or greater than current $I_{BIAS}$ in thee case where transistors 30, 32, identically match one another (or by a multiple of current $I_{BIAS}$ if the size of transistor 32 is a multiple of that of transistor 30). As line CLPBDATA is pulled toward AVDD, however, the source current through transistor 32 decreases to a level proportional to current $I_{BIAS}$ upon line CLPBDATA reaching power supply voltage AVDD. The signal on line CLPBDATA is therefore clipped to a maximum voltage at about power supply voltage AVDD, regardless of the voltage of the signal on line BDATA.

As discussed above, clipping circuit 20' provides the important advantages of reliable clipping of high voltage input signals, in a manner that is robust relative to variations in its manufacture. This clipping is achieved with very little load on the input signal, thus facilitating the use of this clipping circuit according to this embodiment of the invention in sensitive circuit applications, such as battery powered systems.

However, it is contemplated that in many systems a sufficiently high battery voltage VBAT, or other power supply voltage, may not be available. As noted above, the bias voltage applied to current source 29 must exceed the source voltage of transistor 30 by at least a threshold voltage, plus any voltage drop across current source 29 itself. In many systems, however, this high bias voltage may not be available. For example, a typical cellular telephone may have a battery voltage VBAT nominally at about 3.0 volts, and a corresponding regulated power supply voltage AVDD of 2.75 volts. In this case, the battery voltage VBAT would not be sufficiently above voltage AVDD to adequately bias clipping circuit 20'.

Figure 6:
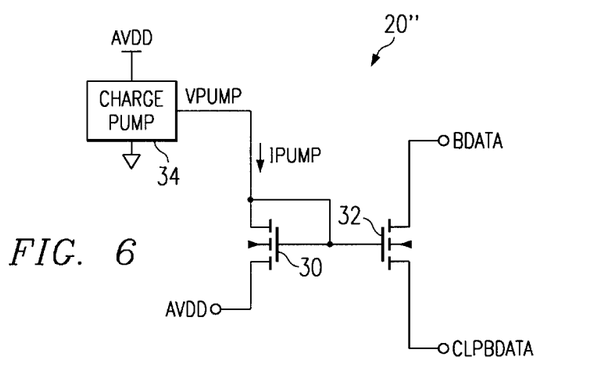
FIG. 6 is an electrical diagram, in a generalized schematic form, of a clipping circuit according to a second preferred embodiment of the invention.

Referring now to FIG. 6, clipping circuit 20" according to a second preferred embodiment of the invention will now be described. Clipping circuit 20" according to this embodiment of the invention provides the desired clipping function, without requiring a voltage significantly higher than biasing power supply voltage AVDD. Clipping circuit 20" includes transistors 30, 32 connected in a current mirror-like fashion, as described above relative to generalized ed clipping circuit 20 and clipping circuit 20'. As before, transistor 32 has its source-drain path connected between lines BDATA, CLPBDATA, and its gate connected to the drain and gate of transistor 30. Transistor 30 has its source biased to power supply voltage AVDD.

In clipping circuit 20" according to this embodiment of the invention, charge pump 34 biases the drain of transistor 30 to a voltage VPUMP, sourcing a current IPUMP. According to this embodiment of the invention, charge pump 34 is biased by regulated power supply voltage AVDD, but is able to pump voltage VPUMP to a voltage significantly higher than voltage AVDD. As will be described in further detail below, the current IPUMP is not a steady-state or DC current according to this embodiment of the invention, but is instead a time-varying current over the period of operation of the circuit. In this manner, clipping circuit 20" will be able to provide a limited amount of pull-up current to line CLPBDATA through transistor 32 in the event that line BDATA is at a voltage significantly higher than power supply voltage AVDD; this current is limited in time and magnitude, so that the voltage on line CLPBDATA is able to be pulled up to, but not substantially above, voltage AVDD.

Figure 7:
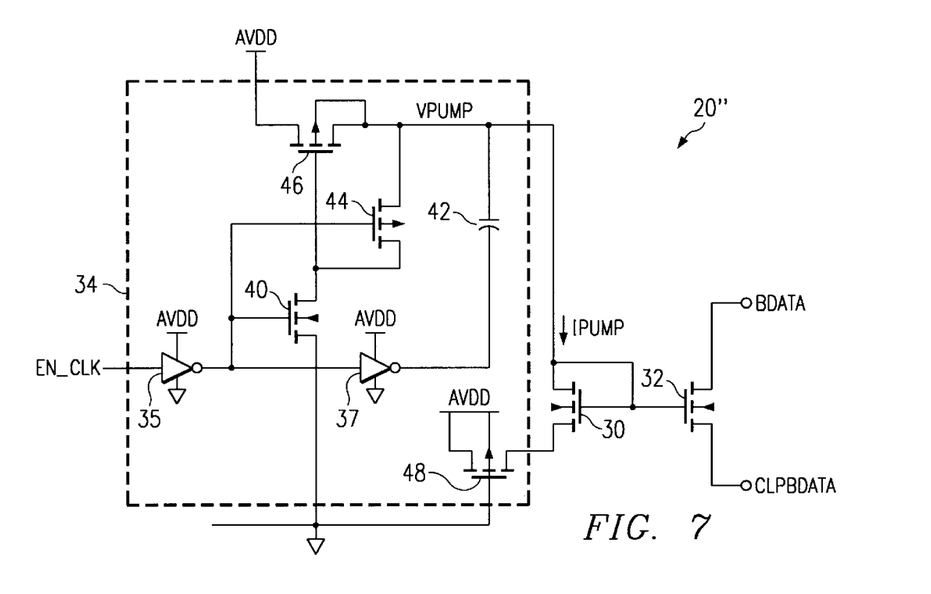
FIG. 7 is an electrical diagram, in a detailed schematic form, of a clipping circuit according to the second preferred embodiment of the invention.

Referring now to FIG. 7, the construction and operation of charge pump 34 will now be described in detail. Charge pump 34, as noted above relative to FIG. 6, is biased between regulated power supply voltage AVDD and circuit ground. Cock signal EN_CLK is received at an input of charge pump 34, namely at an input of inverter 35. The output of inverter 35 is connected to the input of inverter 37. Each of inverters 35, 37 are biased by regulated power supply AVDD and ground. The output of inverter 37 is connected to one plate of capacitor 42. Capacitor 42 has its other plate connected to the drain of transistor 30, at node VPUMP. As such, the alternating states in each cycle of clock signal EN_CLK drive this lower plate of capacitor 42 with AVDD and ground, respectively.

The output of inverter 35 is also connected to the gates of transistors 40, 44, respectively. In this example, transistor 40 is an n-channel MOS transistor while transistor 44 is a p-channel MOS transistor; the drains of transistors 40, 44 are connected to one another, so that transistors 40, 44 operate in similar fashion as a CMOS inverter, with one or the other of transistors 40, 44 being on at any given time. The source of transistor 40 is connected to circuit ground, while the source of transistor 44 is connected to the drain and substrate node of p-channel MOS transistor 46, and to the top plate of capacitor 42, at node VPUMP. The common drain nodes of transistors 40, 44 are connected to the gate of p-channel MOS transistor 46, the source of which is biased to regulated power supply voltage AVDD.

Also according to this embodiment of the invention, p-channel MOS transistor 48 is provided within charge pump 34, and has its source-drain path connected between power supply voltage AVDD and the source of n-channel MOS transistor 30; the gate of transistor 48 is biased to ground. Transistor 48 effectively serves as a damping resistor in the network including capacitor 42 and transistor 30. In this regard, transistor 48 is preferably constructed as a relatively long channel device, so as to present a significant source-drain resistance. As will be described below, this resistance will serve to control the decay time of current IPUMP conducted by transistor 30 from capacitor 42. Transistor 48 is entirely optional, however, and may be omitted if the time constant established by capacitor 42 and transistor 30 is satisfactory for the desired circuit performance.

The operation of charge pump 34 will now be described, relative to the example of a succession of high and low levels on clock input EN_CLK, beginning with an initial condition of clock signal EN_CLK at a low level. This low level drives the output of inverter 35 high, and in turn the output of inverter 37 low, so that a ground level voltage is driven at the bottom plate of capacitor 42. The high level at the output of inverter 35 turns on transistor 40, and turns off transistor 44. Transistor 40 thus pulls down the gate of transistor 46, turning on transistor 46 so that power supply voltage AVDD is applied to the top plate of capacitor 42 at node VPUMP.

Upon a low-to-high transition of clock input EN_CLK, the output of inverter 35 is driven low, and the output of inverter 37 follows with a high level, effectively charging the bottom plate of capacitor 42 toward power supply voltage AVDD. Meanwhile, the low level at the output of inverter 35 turns off transistor 40, and turns on transistor 44. The voltage across capacitor 42 will remain at its then-current voltage, but the voltage at the top plate of capacitor 42 at node VPUMP will rise as the voltage at the bottom plate of capacitor 42 is charged toward power supply voltage AVDD. This voltage will not discharge to power supply AVDD through transistor 46, because this higher voltage on node VPUMP is applied to the gate and drain of transistor 46, effectively biasing transistor 46 as a reverse-biased diode. This diode action allows the voltage at node VPUMP at the top plate of capacitor 42 to float to a higher voltage as the bottom plate of capacitor 42 is charged toward AVDD. Node VPUMP then only discharges through transistor 30 (and transistor 48, if present), via current IPUMP.

This process is repeated with each cycle of clock signal EN_CLK, with each charge pump cycle replenishing capacitor 42 to the extent it is discharged. Each leading edge of clock signal EN_CLK instantaneously pumps the voltage VPUMP at the top plate of capacitor 42 to a high voltage above power supply voltage AVDD. A pulse of current IPUMP through transistor 30, limited by transistor 48 and the charge stored by capacitor 42, is thus available for a sample in each cycle. This current IPUMP is mirrored by transistor 32 for those cycles in which the input signal on line BDATA is above power supply voltage AVDD. Because the current IPUMP is limited, the mirrored pull-up current through transistor 32 in this situation is also limited, resulting in the clipping operation of clipping circuit 20" as will now be described in connection with FIG. 8 in combination with FIG. 7.

Figure 8:
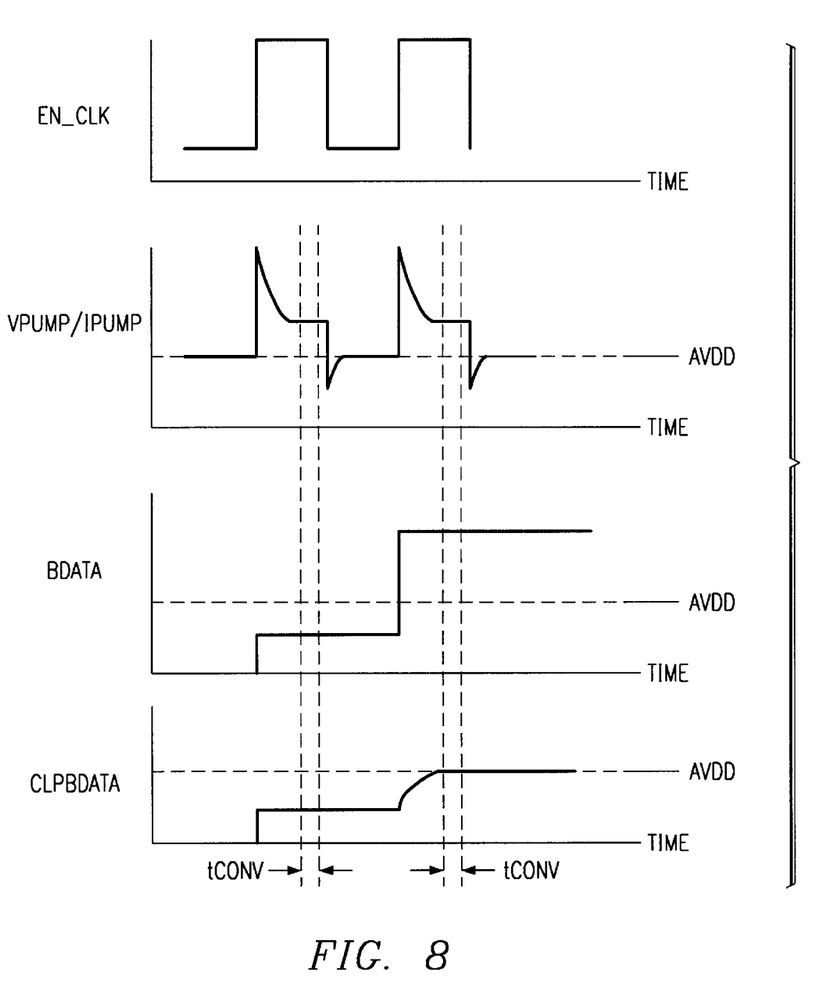
FIG. 8 is an timing diagram illustrating the operation of the clipping circuit of FIG. 7 according to the second preferred embodiment of the invention.

In the example of FIG. 8, two cycles of clock signal EN_CLK are illustrated, by way of example. As shown in FIG. 8, the leading edge (low-to-high transition) of clock signal EN_CLK causes node VPUMP to spike above power supply voltage AVDD; current IPUMP through transistor 30 also spikes up at this time. In this first exemplary cycle, signal BDATA makes a transition from ground to a level below power supply voltage AVDD, for example AVDD/2. With line EN_CLK low, transistor 46 maintains the gate of transistor 30 at about power supply voltage AVDD. Voltages at line BDATA below a level at about power supply voltage AVDD, less a threshold voltage, are then immediately passed by transistor 32 to line CLPBDATA. In this example, therefore, the voltage of line CLPBDATA immediately follows the voltage of line BDATA in this transition, as shown in FIG. 8. In the latter part of the half-cycle of clock signal EN_CLK, line CLPBDATA is sufficiently stable that its level may be forwarded to downstream low-power circuit 25 (FIG. 3). This stable time interval is illustrated in FIG. 8 as interval tCONV.

In the example of FIG. 8, the next cycle of clock signal EN_CLK illustrates the operation of clipping circuit 20" when the signal on line BDATA is significantly higher than regulated power supply voltage AVDD. Upon node VPUMP sourcing the pulse of current IPUMP responsive to the leading edge of clock signal EN_CLK, transistor 32 is turned on along with transistor 30. Transistor 32 then pulls up line CLPBDATA toward its drain voltage of BDATA, by way of a mirrored current based upon transient current IPUMP. The mirrored current through transistor 32 is preferably matched 1:1, or alternatively may be a multiple or fraction of the current through transistor 30, depending upon the transistor ratio of transistors 30, 32. Transistor 32 then pulls up its source at line CLPBDATA with a mirrored current corresponding to the transient current IPUMP. As shown in FIG. 8, this charging of line CLPBDATA continues for the duration of the transient current IPUMP, pulling line CLPBDATA to a voltage approaching regulated power supply voltage AVDD. This level is reached, in this embodiment of the invention, within the first portion of this half-cycle of clock signal EN_CLK, so that a stable clipped voltage appears on line CLPBDATA during functional interval tCONV as shown in FIG. 8.

Transistor 48, as noted above, serves as an optional resistor in clipping circuit 20" according to this embodiment of the invention. The characteristics of transistor 48 serve to control the amplitude and width of the spike in current IPUMP responsive to the leading edge of clock signal EN_CLK. While a diffused or polysilicon resistor may be used instead of transistor 48, the realization of this device as a transistor permits greater control of the charging duration by a smaller device, in terms of integrated circuit chip area. Selection of the characteristics of transistor 48 in combination with the capacitance of capacitor 42, for a given clipping application, may be readily made by those skilled in the art having reference to this specification.

According to this embodiment of the invention, as before, clapping circuit 20" provides the important advantages of reliable clipping of high voltage input signals, in a manner that is robust relative to process variations, and with little load on the input signal. This embodiment of the invention provides still further advantages, in that it does not require the presence of a bias supply voltage above the regulated power supply voltage in the circuit. Further, each implementation of the clipping circuit according to the present invention may be realized very efficiently from the chip area standpoint. This efficiency may be readily seen from the relatively few number of relatively small devices in charge pump 34 according to this embodiment of the invention. For example, clipping circuit 20" may be realized in as little area as 70µ by 70µ, according to modern technology. Additionally, no DC current is dissipated by clipping circuit 20" according to this embodiment of the invention; rather, the only power dissipation occurs in the transient events.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A clipping circuit, comprising:
   a current source device, biased to a voltage that is greater in magnitude than the power supply voltage, for sourcing a reference current at an output;
   a reference transistor, having a conduction path coupled on a first end to the output of the current source device and coupled on a second end to a power supply voltage, the reference transistor also having a control electrode connected to the first end of its conduction path; and
   a mirror transistor, having a conduction path with a first end for receiving an input signal and a second end for presenting an output signal, and having a control electrode connected to the control electrode of the reference transistor so that, responsive to receiving an input signal at a voltage above the power supply voltage, the mirror transistor presents an output signal at a voltage at or below the power supply voltage.

2. The clipping circuit of claim 1, wherein the mirror transistor has a size that is an integral multiple of the size of the reference transistor.

3. A clipping circuit, comprising:
   a current source having a charge pump circuit biased by the power supply voltage and having an output coupled to the first end of the conduction path of the reference transistor, for sourcing a reference current at an output;
   a reference transistor, having a conduction path coupled on a first end to the output of the current source and coupled on a second end to a power supply voltage, the reference transistor also having a control electrode connected to the first end of its conduction path; and
   a mirror transistor, having a conduction path with a first end for receiving an input signal and a second end for presenting an output signal, and having a control electrode connected to the control electrode of the reference transistor so that, responsive to receiving an input signal at a voltage above the power supply voltage, the mirror transistor presents an output signal at a voltage at or below the power supply voltage.

4. The clipping circuit of claim 3, wherein the charge pump circuit comprises:
   a capacitor, having a first plate coupled to the first end of the conduction path of the reference transistor, and having a second plate;
   charge pump logic circuitry, having an input for receiving a clock signal, for coupling the second plate of the capacitor alternately to the power supply voltage and to a reference voltage, and for alternately isolating the first plate of the capacitor and coupling the first plate to the power supply voltage.

5. The clipping circuit of claim 4, wherein the charge pump logic circuitry comprises:
   a first inverter having an input coupled to receive the clock signal and having an output;
   a second inverter having an input coupled to the output of the first inverter and an output coupled to the second plate of the capacitor, the second inverter biased to the power supply voltage and the reference voltage;
   an isolation transistor having a conduction path connected between the power supply voltage and the first plate of the capacitor, and having a control electrode;
   a switching circuit having an input coupled to the output of the first inverter and an output coupled to the control electrode of the isolation transistor, for biasing the isolation transistor as a diode responsive to the clock signal at a first logic level, and for turning on the isolation transistor responsive to the clock signal at a second logic level;
   wherein the second inverter drives its output substantially to the power supply voltage responsive to the clock signal being at the first logic level, and drives its output substantially to the reference voltage responsive to the clock signal being at the second logic level.

6. The clipping circuit of claim 5, further comprising:
   a resistor connected between the second end of the reference transistor and the power supply voltage.

7. The clipping circuit of claim 6, wherein the resistor comprises a transistor biased into a conductive state.

8. A clipping circuit, comprising:
   a current source for sourcing a reference current at an output;
   a reference transistor, having a conduction path coupled on a first end to the output of the current source and coupled on a second end to a power supply voltage, the reference transistor also having a control electrode connected to the first end of its conduction path;
   a mirror transistor, having a conduction path with a first end for receiving an input signal and a second end for presenting an output signal, and having a control electrode connected to the control electrode of the reference transistor so that, responsive to receiving an input signal at a voltage above the power supply voltage, the mirror transistor presents an output signal at a voltage at or below the power supply voltage; and a resistor connected between the second end of the reference transistor and the power supply voltage.

9. The clipping circuit of claim 8, wherein the resistor comprises a transistor biased into a conductive state.

10. A clipping circuit, comprising:
   a current source for sourcing a reference current at an output;
   a reference transistor, having a conduction path coupled on a first end to the output of the current source and coupled on a second end to a power supply voltage, the reference transistor also having a control electrode connected to the first end of its conduction path;
   a mirror transistor, having a conduction path with a first end for receiving an input signal and a second end for presenting an output signal, and having a control electrode connected to the control electrode of the reference transistor so that, responsive to receiving an input signal at a voltage above the power supply voltage, the mirror transistor presents an output signal at a voltage at or below the power supply voltage; and
   wherein the mirror transistor and reference transistor have 1:1 matched sizes.

11. A method of clipping an input signal below a selected voltage, comprising the steps of:
   generating a bias current through a reference transistor in a reference leg of a current mirror, the reference leg biased to a power supply voltage, wherein the step of generating a bias current comprises biasing a current source device with a voltage greater than the power supply voltage, to produce the bias current;
   receiving the input signal at a conduction path of a mirror transistor, the mirror and reference transistors having control electrodes connected to one another and to the reference leg;
   responsive to the input signal being above the power supply voltage, pulling up an output node coupled to the mirror transistor with a mirror current corresponding to the bias current; and
   responsive to the output node being pulled up to the selected voltage, turning off the mirror transistor.

12. An electronic system, comprising:
   a battery, producing a battery voltage;
   a voltage regulator, for generating a regulated power supply voltage from the battery voltage;
   functional circuitry, biased by the voltage regulator, for receiving at least a first input and carrying out an electronic function;
   support circuitry, biased by the voltage regulator, for receiving at least the first input and carrying out a support function; and
   a clipping circuit, comprising:
      a current source for sourcing a reference current at an output;
      a reference transistor, having a conduction path coupled on a first end to the output of the current source and coupled on a second end to the regulated power supply voltage, the reference transistor also having a control electrode connected to the first end of its conduction path; and
      a mirror transistor, having a conduction path with a first end for receiving the first input and a second end for presenting an output signal, and having a control electrode connected to the control electrode of the reference transistor so that, responsive to the first input being at a voltage above the regulated power supply voltage, the mirror transistor presents an output signal at a voltage at or below the regulated power supply voltage.

13. The system of claim 12, wherein the current source comprises:
   a current source device biased to a voltage that is greater in magnitude than the regulated power supply voltage.

14. The system of claim 12, wherein the current source comprises:
   a charge pump circuit biased by the regulated power supply voltage, and having an output coupled to the first end of the conduction path of the reference transistor.

15. The system of claim 14, wherein the charge pump circuit comprises:
   a capacitor, having a first plate coupled to the first end of the conduction path of the reference transistor, and having a second plate;
   charge pump logic circuitry, having an input for receiving a clock signal, for coupling the second plate of the capacitor alternately to the power supply voltage and to a reference voltage, and for alternately isolating the first plate of the capacitor and coupling the first plate to the regulated power supply voltage.

16. The system of claim 14, wherein the charge pump logic circuitry comprises:
   a first inverter having an input coupled to receive the clock signal and having an output;
   a second inverter having an input coupled to the output of the first inverter and an output coupled to the second plate of the capacitor, the second inverter biased to the regulated power supply voltage and the reference voltage;
   an isolation transistor having a conduction path connected between the regulated power supply voltage and the first plate of the capacitor, and having a control electrode;
   a switching circuit having an input coupled to the output of the first inverter and an output coupled to the control electrode of the isolation transistor, for biasing the isolation transistor as a diode responsive to the clock signal at a first logic level, and for turning on the isolation transistor responsive to the clock signal at a second logic level;
   wherein the second inverter drives its output substantially to the regulated power supply voltage responsive to the clock signal being at the first logic level, and drives its output substantially to the reference voltage responsive to the clock signal being at the second logic level.

17. The system of claim 16, further comprising:
   a resistor connected between the second end of the reference transistor and the power supply voltage.

18. The system of claim 17, wherein the resistor comprises a transistor biased into a conductive state.

19. The system of claim 12, wherein the mirror transistor and reference transistor have 1:1 matched sizes.

20. The system of claim 12, wherein the mirror transistor has a size that is an integral multiple of the size of the reference transistor.

21. A method of clipping an input signal below a selected voltage, comprising the steps of:
   generating a bias current through a reference transistor in a reference leg of a current mirror, the reference leg biased to a power supply voltage wherein the step of generating a bias current comprises:

applying a periodic signal to a charge pump circuit;
biasing the charge pump circuit to the power supply voltage;
responsive to the periodic signal, operating the charge pump circuit to produce a pumped voltage at a capacitor, the pumped voltage being above the power supply voltage; and
discharging the capacitor through the reference transistor, to produce the bias current;

receiving the input signal at a conduction path of a mirror transistor, the mirror and reference transistors having control electrodes connected to one another and to the reference leg;

responsive to the input signal being above the power supply voltage, pulling up an output node coupled to the mirror transistor with a mirror current corresponding to the bias current; and responsive to the output node being pulled up to the selected voltage, turning off the mirror transistor.

22. The method of claim 21, further comprising:

controlling the bias current characteristics with a resistor connected between the reference transistor and the power supply voltage.

* * * * *